United States Patent
Garnett

(10) Patent No.: US 7,321,312 B1
(45) Date of Patent: Jan. 22, 2008

(54) NON-VOLATILE FAULT INDICATION

(75) Inventor: Paul J. Garnett, Camberley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 243 days.

(21) Appl. No.: 10/863,111

(22) Filed: Jun. 8, 2004

(51) Int. Cl.
*G08B 21/00* (2006.01)

(52) U.S. Cl. .......... 340/653; 340/635; 702/58; 702/59; 714/25; 714/42; 714/48

(58) Field of Classification Search .......... 340/660, 340/653; 714/5, 25, 42, 48; 702/58, 59
See application file for complete search history.

(56) References Cited

U.S. PATENT DOCUMENTS

| | | | | |
|---|---|---|---|---|
| 5,056,092 A | * | 10/1991 | Bruner | 714/24 |
| 5,070,301 A | * | 12/1991 | Schweitzer, Jr. | 340/664 |
| 5,673,028 A | * | 9/1997 | Levy | 340/635 |
| 6,038,680 A | * | 3/2000 | Olarig | 714/6 |
| 6,114,866 A | * | 9/2000 | Matsuo et al. | 324/760 |
| 6,185,718 B1 | * | 2/2001 | Dell et al. | 714/800 |
| 6,452,809 B1 | | 9/2002 | Jackson et al. | |
| 6,556,438 B1 | | 4/2003 | Bolognia et al. | |
| 6,583,989 B1 | | 6/2003 | Guyer et al. | |
| 6,644,556 B2 | * | 11/2003 | Adelmann | 235/492 |
| 6,651,138 B2 | * | 11/2003 | Lai et al. | 711/115 |
| 6,747,563 B2 | * | 6/2004 | Post et al. | 340/693.5 |
| 6,785,785 B2 | * | 8/2004 | Piccirillo et al. | 711/157 |
| 2002/0124114 A1 | | 9/2002 | Bottom et al. | |
| 2003/0030990 A1 | | 2/2003 | King et al. | |
| 2003/0033364 A1 | | 2/2003 | Garnett et al. | |
| 2003/0033366 A1 | | 2/2003 | Garnett et al. | |
| 2003/0033399 A1 | | 2/2003 | Garnett et al. | |
| 2003/0033409 A1 | | 2/2003 | King et al. | |
| 2003/0033460 A1 | | 2/2003 | King et al. | |
| 2003/0033544 A1 | | 2/2003 | King et al. | |
| 2003/0048615 A1 | | 3/2003 | King et al. | |
| 2003/0051167 A1 | | 3/2003 | King et al. | |
| 2004/0078711 A1 | | 4/2004 | King et al. | |
| 2005/0049825 A1 | | 3/2005 | King et al. | |
| 2005/0160311 A1 | * | 7/2005 | Hartwell et al. | 714/7 |

* cited by examiner

*Primary Examiner*—Jeffery Hofsass
*Assistant Examiner*—Samuel J. Walk
(74) *Attorney, Agent, or Firm*—Meyertons Hood Kivlin Kowert & Goetzel, P.C.; B. Noël Kivlin

(57) ABSTRACT

In a computer system a non-volatile fault indicator in a positional relationship with at least one system component is settable to maintain a fault indication for the component after powering down of the computer system.

24 Claims, 12 Drawing Sheets

NON-VOLATILE FAULT INDICATION

BACKGROUND OF THE INVENTION

The present invention relates to computer systems, and to the diagnosis of computer system errors.

Computer systems are becoming more complex and as a direct result more difficult to diagnose when they go wrong. One area for faults resides in the memory units used in computer systems. Such memory can, for example be in the form of Dual In-line Memory Modules (DIMMs). The DIMMs are typically mounted in sockets within the computer system. Due to the solid-state nature of a DIMM it is not, however apparent from the outside when there is a fault in the DIMM.

In a computer server, for example a blade server or a thin server that forms part of a server array, when faults are diagnosed during operation, the nature of the faults are typically communicated to a remote controller. However, even in this case, the faults need to be further communicated to a service engineer who is to repair the fault. Even then, identifying the faulty DIMM may not be straightforward.

The present invention seeks to facilitate the identification of faulty components of a computer system.

SUMMARY OF THE INVENTION

In one aspect of the invention a computer system comprises a plurality of system components, and in a positional relationship with at least one system component, a non-volatile fault indicator that is settable to indicate a fault during operation of the computer system and is operable to maintain the fault indication after powering down of the computer system.

An embodiment of the invention is thus able to provide a clear indication to a service operator of a component that is faulty. In this manner the service operator is able more reliably to identify and replace the correct system component. This reduces that risk of the service operator replacing the wrong component. It also reduces the number of components that are returned for repair only to find that they are not faulty. Moreover, the use of a non-volatile fault indicator means that a backup source of power for the fault indicator is not needed.

In an example embodiment each non-volatile fault indicator is located adjacent to a respective system component. Alternatively, however, the non-volatile fault indicator could be integrated in a socket for the system component, or into the system component itself. The computer system component can, for example, be a memory module.

In an example embodiment, the non-volatile fault indicator comprises a display that is settable to display a fault symbol. The display can be a display that only requires power to change a displayed state, for example a zenithal bistable display.

Another aspect of the invention provides a method of indicating a fault in a system component of a computer system that comprises a plurality of system components, the method comprising:

during operation of the computer system, setting a non-volatile fault indicator in positional relationship with a system component that has developed a fault; and the non-volatile fault indicator maintaining the fault indication after powering down of the computer system.

In an example embodiment, a system controller of the computer system, on detecting a fault in the system component, sets the non-volatile fault indicator for the system component. The system controller can also be operable, on detecting a fault in the system component, to report the fault to a remote system administrator.

Accordingly, embodiments of the invention can provide, in a computer system, a non-volatile fault indicator in a positional relationship with at least one system component that is settable to maintain a fault indication for the component after powering down of the computer system.

BRIEF DESCRIPTION OF THE DRAWINGS

Embodiments of the present invention will be described hereinafter, by way of example only, with reference to the accompanying drawings in which like reference signs relate to like elements and in which.

Figure 1:
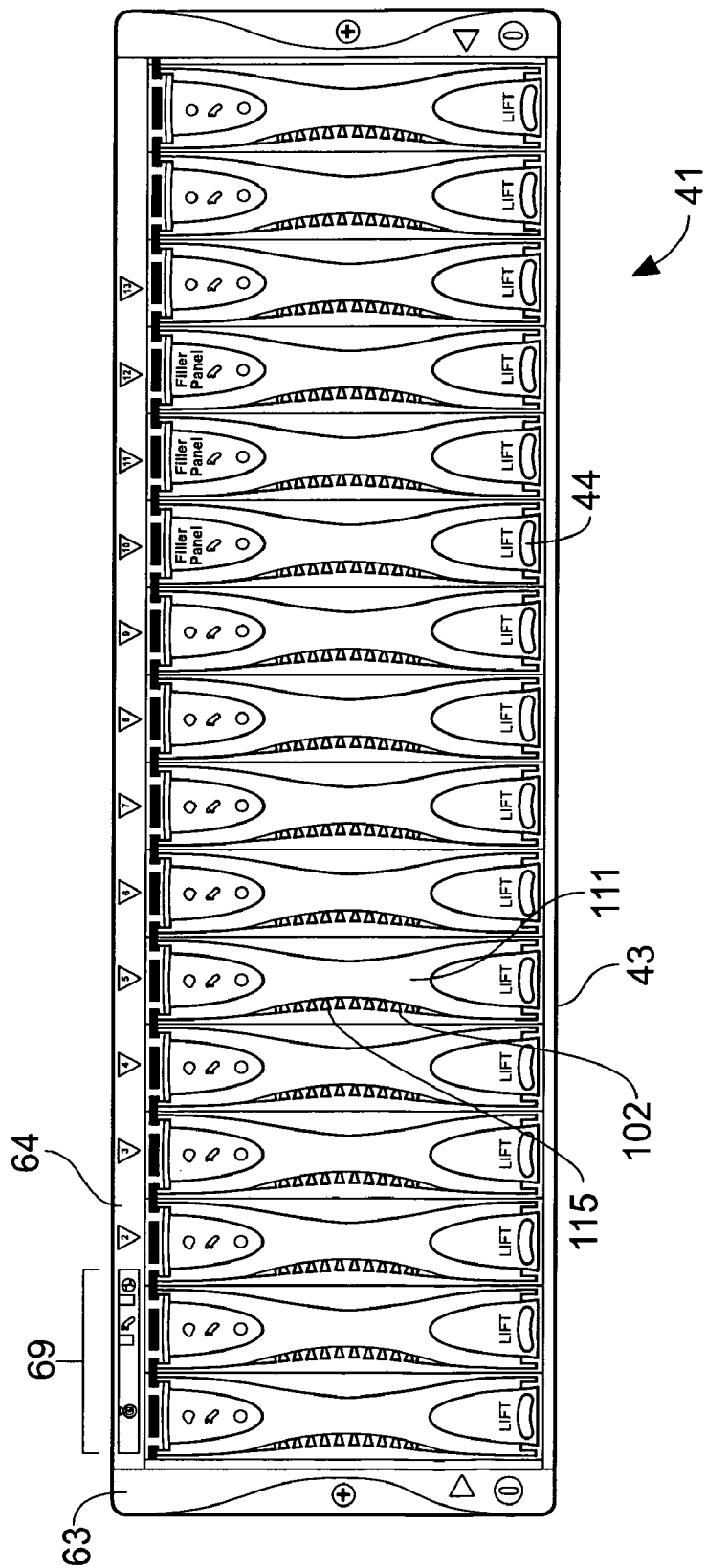
FIG. 1 is a front view of an example of a shelf in a rack mountable computer system comprising field replaceable units.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims. In this regard, combinations of features from the independent claims with features of dependent claims other than as presented by the dependencies of the claims, and also with features from the description, are envisaged.

DESCRIPTION OF PARTICULAR EMBODIMENTS

Embodiments and examples are described hereafter by way of example only in the following with reference to the accompanying drawings.

FIG. 1 is a front view of a shelf 41 comprised in a rack mountable computer system. A plastic front bezel 63 can be provided that fits on the front face of the shelf. The front bezel 63 could include a number of separate components, or mouldings. The front bezel can include a peripheral portion 64 that can provide areas for corporate and product branding marks, for identification and numbering for the information processing cartridge and for a bar code label (all not shown). Where no active module is mounted in a location for an information processing module, a blanking panel, or filler panel, such as the blanking panel 44, can be located in that location. Indicators lights 69 such as LEDs can be mounted behind a designated area of the bezel to provide an indication of system status via light guides. A further system indicator assembly accommodating indicator lights can be provided inside the shelf enclosure to be visible from the rear thereof (see FIG. 2).

In the present example of a shelf, up to sixteen information processing cartridges 43 can be installed in respective openings 45 in the front face 57. The number of information processing cartridges 43 actually installed in any installation is dependent upon the system configuration required.

Figure 2:
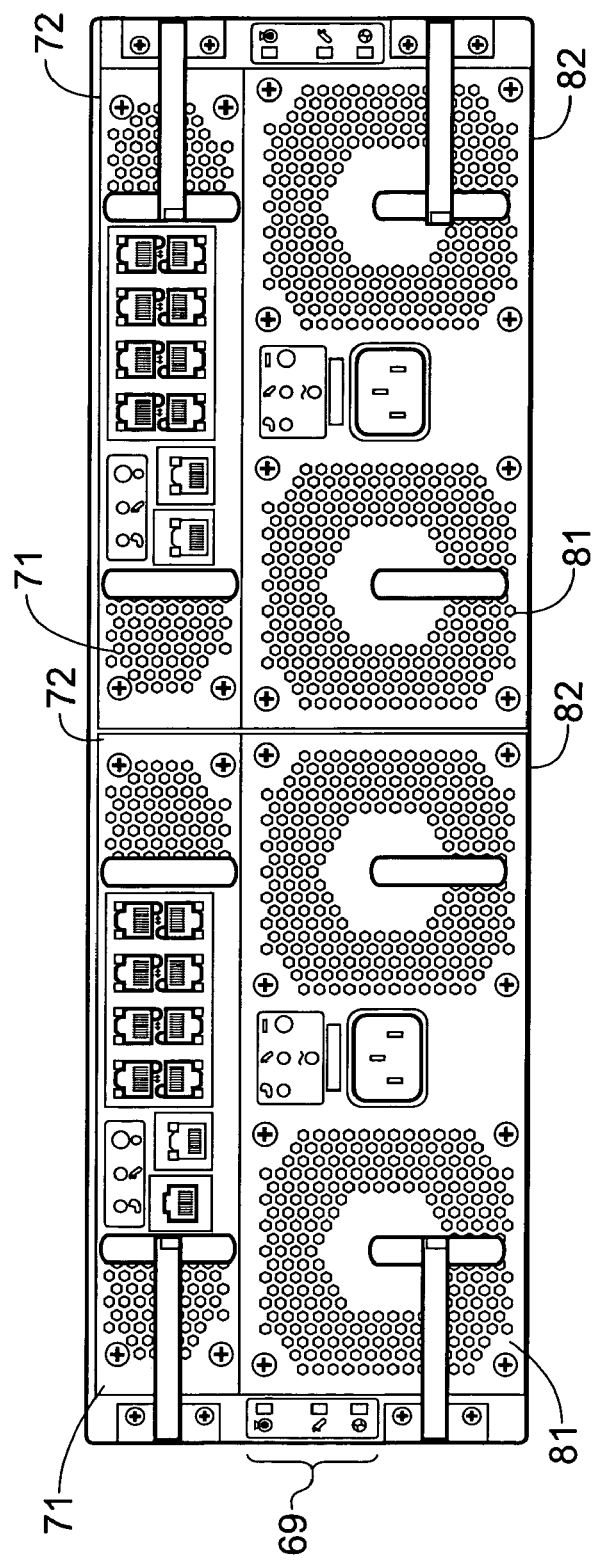
FIG. 2 is a rear view of an example of the shelf of FIG. 1.

FIG. 2 illustrates the rear of the shelf unit of FIG. 1. This shows two different types of FRU 71 and 81 (4 units in total) that have been inserted into respective apertures 72 and 82 in the rear of the shelf. The FRUs shown in FIG. 2 include two Combined Switch and Service Processors (CSSPs) 71 and two Power Supply Units (PSUs) 81. Indicator lights 69 such as LEDs can be mounted behind one side of the rear of the shelf unit in the present instance. Light guides can direct light from the LEDs to provide an indication of system status at the rear of the shelf.

Figure 3:
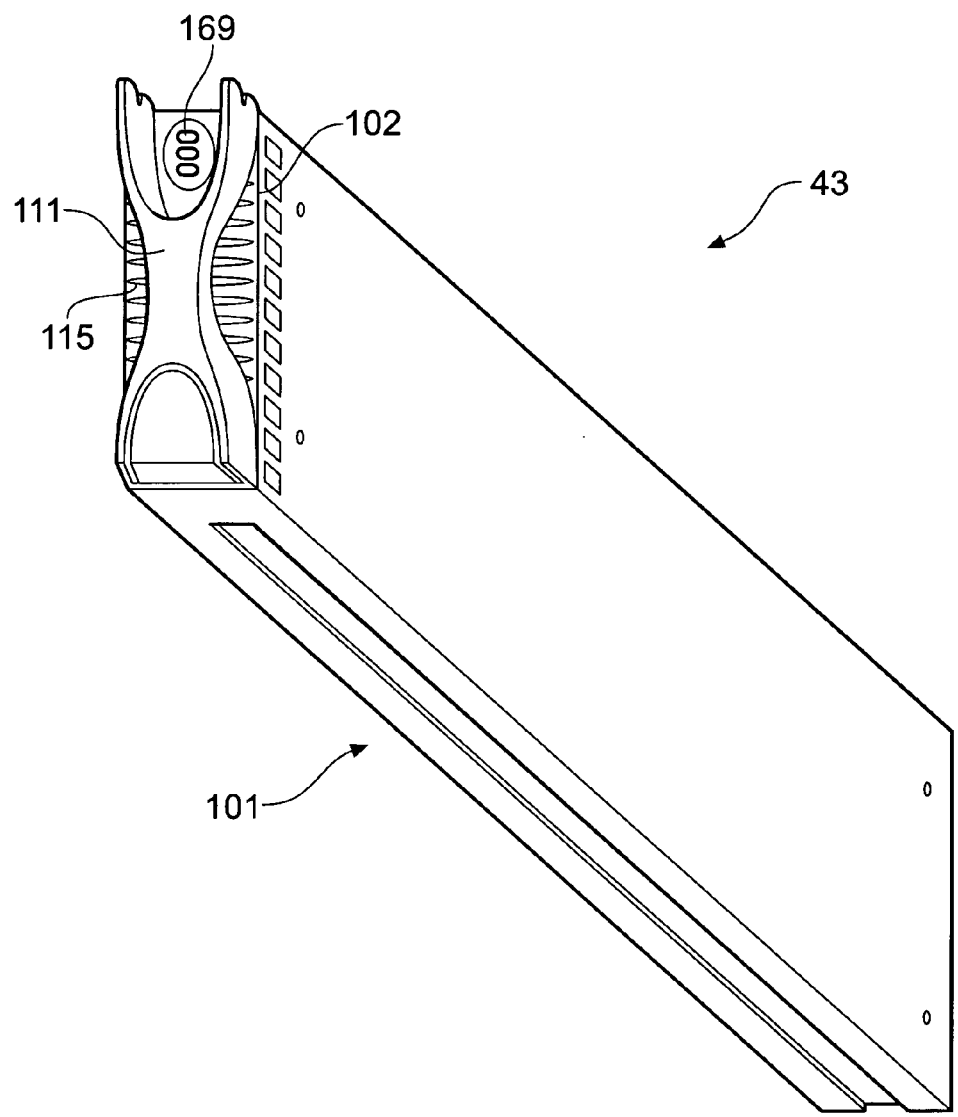
FIG. 3 is a schematic perspective view of an example of an information processing cartridge mountable in the shelf of FIGS. 1 and 2.

FIG. 3 provides a perspective view, partly from the front of an information processing cartridge 43.

Each of the information processing cartridges contains at least one processor. Each information processing cartridge in the present example is operable as a server. In the described examples, the information processing cartridges are configured as robust enclosed modules.

The provision of the enclosure 101 means that the information processing cartridge 43 can safely be handled by an operator who is not a skilled technician. Also, through the use of the enclosure 101, the information processing cartridge is a robust unit that protects its inner workings from the outside environment and vice versa. The use of a conductive enclosure, e.g., a metal enclosure, can result in the information processing cartridge including its own electromagnetic shielding. To this end, the enclosure 101 can also be provided with an internal electromagnetic interference (EMI) shielding.

As shown in FIGS. 1 and 3, the information processing cartridge 43 incorporates an injector/ejector handle 111 on the front face 102 for facilitating insertion and latching of the information processing cartridge 43 within an aperture in the shelf 41. The handle 111 of the injector/ejector lever extends substantially the whole height of the front face of the information processing cartridge 43, thereby increasing the mechanical advantage and facilitating injection and ejection of the information processing cartridge 43. The front face 102 of the information processing cartridge 43 has perforations 115, in the present example slits, to allow for airflow into the information processing cartridge 43. It will be noted in FIGS. 1 and 3 that the handle 111 is narrower in its middle than at its ends. This reduces any masking effect of the handle 111 on the airflow to the perforations 115 in the front face of the information processing cartridge 43 and facilitates grasping of handle 111.

The information processing cartridge 43 can also comprise indicators lights 169 such as LED indicators for indicating functional states of the cartridge to the user.

Figure 4:
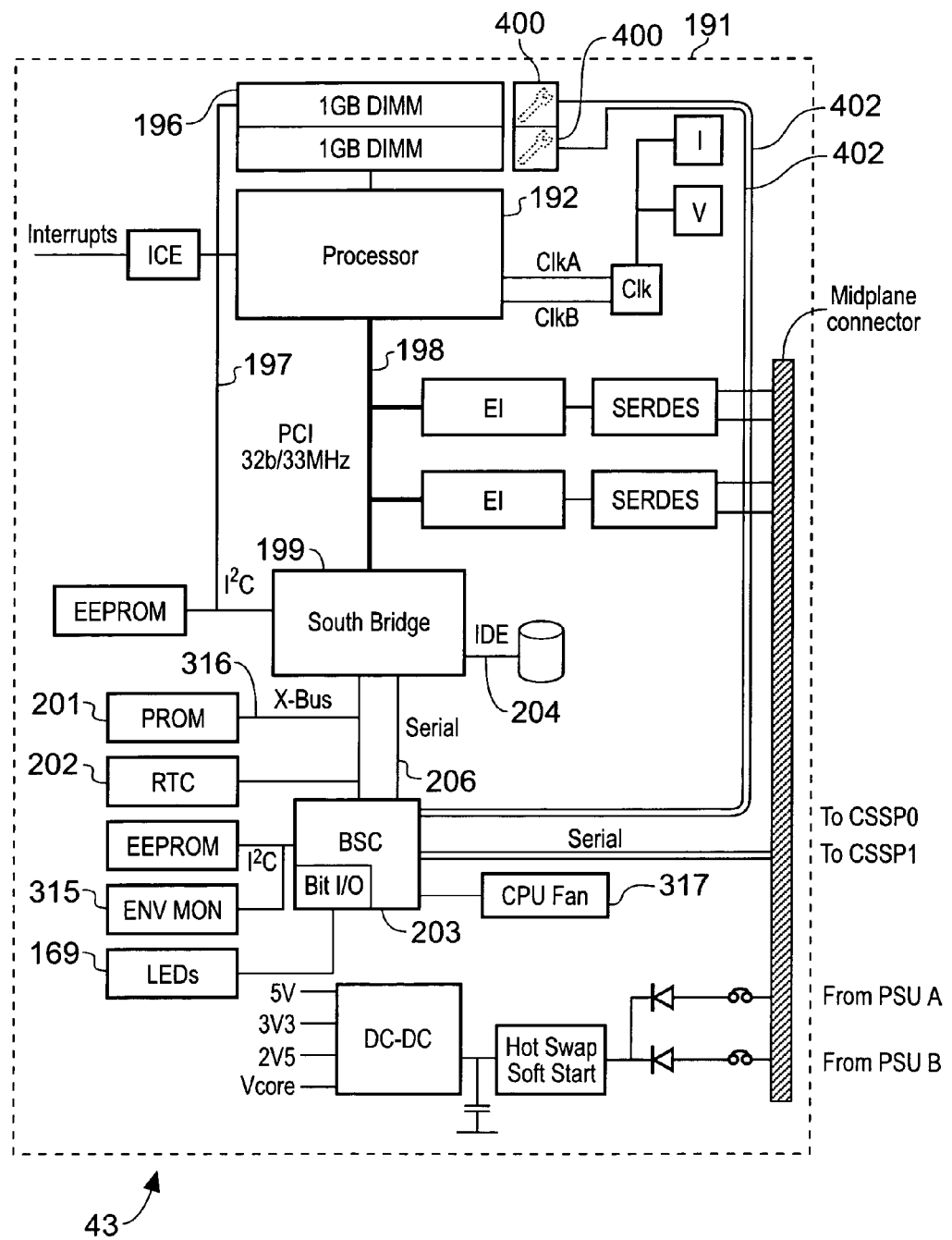
FIG. 4 is a schematic example of the functional elements of an information processing cartridge such as that shown in FIG. 3.

With reference to FIG. 4, there now follows a description of functional elements of an example of an information processing cartridge 43 as contained within the information processing cartridge enclosure 101.

The information processing cartridge 43 includes a microprocessor 192 (a non-limiting example of a microprocessor that can be utilised in the present example is an UltraSPARC™ processor). The microprocessor is mounted on an information processing cartridge motherboard 191.

In the present example, memory means for use by the processor 192 when executing instructions can be provided in the form of buffered dynamic random access memory (DRAM), for example configured as dual in line memory modules (DIMMs) 196.

In the present example, a PCI bus architecture can be employed with a so-called SouthBridge bus bridge 199 with SuperIO and two Gb Ethernet Media Access Control (MAC) devices. Other bus protocols (e.g., Infiniband) can be used. A 32 bit PCI bus 198 can be provided from the microprocessor 192. The SouthBridge 199 is a standard form of bus bridge. It can for example provide the following functions: an SM Bus interface over an I2C bus 197 for access to a SPD (Serial Presence Detect) feature of the DIMMs that allows initialization of the memory controller; an Xbus interface for access via an Xbus 316 (which is a packet switched multi-processor bus) to a PROM 201, a real time clock (RTC) 202 and an information processing cartridge service controller (hereinafter termed a Blade Service Controller (BSC)) 203; an IDE (Integrated Drive Electronics) interface that provides an ATA-100 (AT Attachment) IDE connection 304 to an IDE disk drive 205; and a serial console interface on a service bus 206 to the BSC 203 that is used for operating system functions including a console function.

In the present implementation, the BSC 203 can be implemented as a microcontroller (e.g., a Hitachi H8 microcontroller). The BSC 203 can provide various functions, including for example: dual access (for the information processing cartridges and the CSSPs 71) to PROM 201 and EEPROM 213 for boot information and a FRU-ID for the information processing cartridge; channelling communication between an information processing cartridge 43 and the service processor part of the CSSPs 71; control of power on reset (POR), system reset and externally initiated reset (XIR) to the microprocessor 192; control of the power, service-required and LED indicators 69; upgrading of field-upgradable firmware, via the serial interface; a watchdog function for the operating system; monitoring the speed of a CPU fan 317; and communications with an EEPROM 315 and the operating system via the Xbus 316. The BSC 203 can also be operable to control via control lines 402, the operation of non-volatile fault indicators 400 included in the information processing cartridge 43 in a predetermined positional relationship to at least some of the system components as will be described later in more detail. In the present example, the system components concerned are the memory modules 196.

In the present example, the BSC 203 can be powered by a 5V standby rail as soon as a CSSP 71 and a PSU 81 are fully inserted into the midplane 171, it then turns on other DC/DC converters to provide power to the remainder of the information processing cartridge 43. A BSC reset signal can be derived from a simple conventional power on reset (POR) generator that monitors a 5V supply rail.

Figure 6:
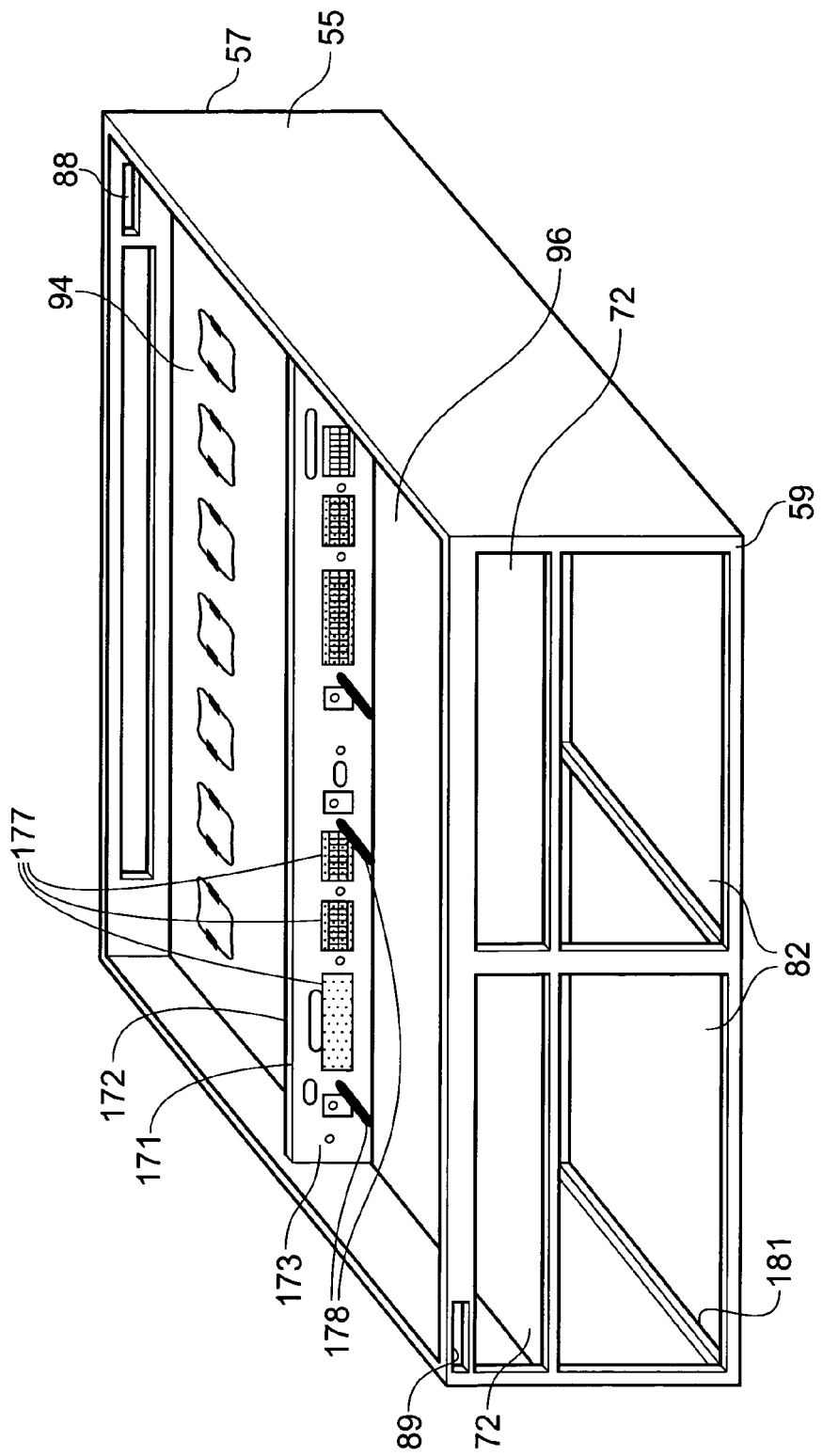
Figure 7:
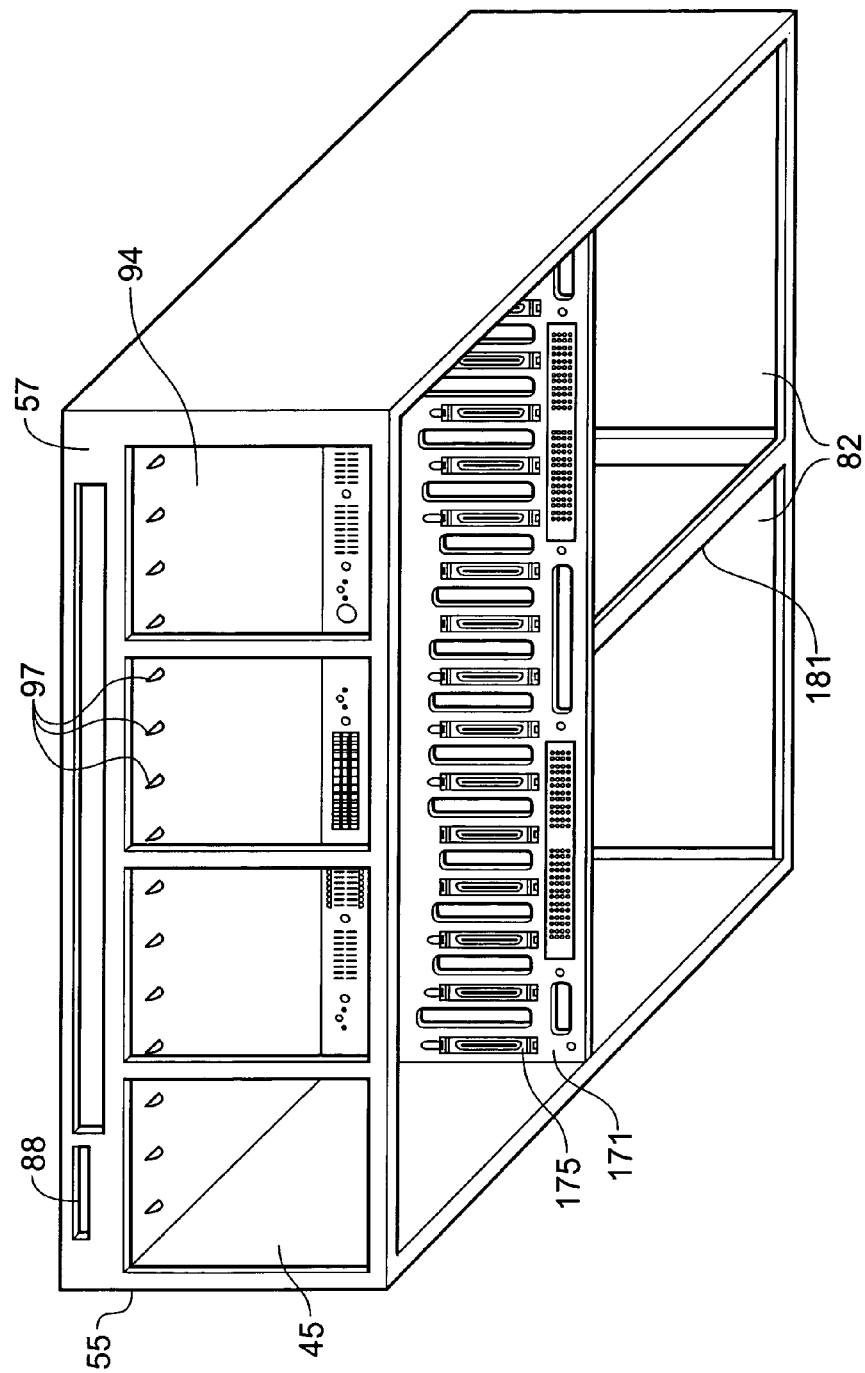

The internal configuration of the shelf 41 and a midplane 171 contained therein is described in the following with reference to FIGS. 5, 6 and 7.

Figure 5:
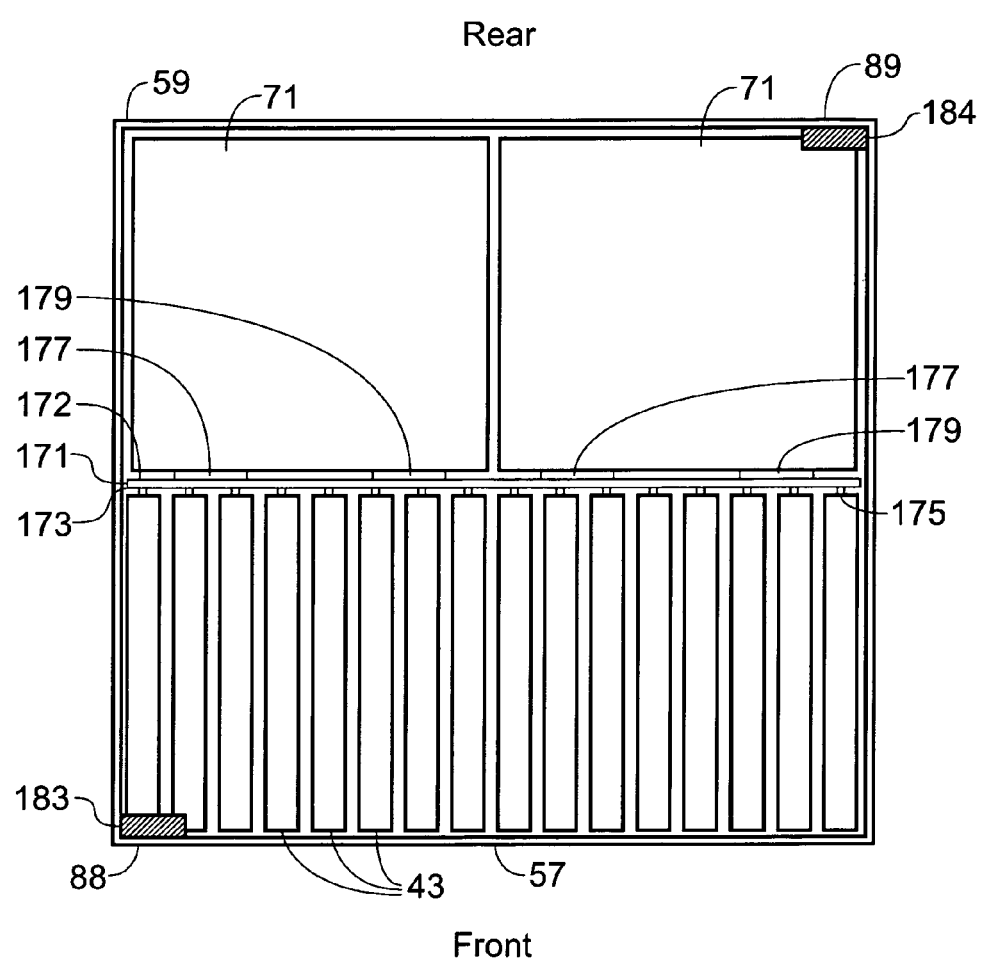
FIGS. 5, 6 and 7 are a schematic plan view and schematic perspective views, respectively, of an example of the chassis and midplane of a shelf in which the information processing cartridge of FIG. 1 may be mounted.

FIG. 5 is a schematic interior plan view of the shelf. FIG. 6 is a schematic perspective view from above the rear of the chassis portion 47 of the shelf enclosure with the field replaceable units removed. FIG. 7 is a schematic perspective view from below the front of the chassis portion 47 of the shelf enclosure with the field replaceable units and the base 51 removed.

The vertically mounted midplane 171 extends, across the shelf 41 and allows for the electrical interconnection of the FRUs. The various apertures in the front and rear faces 57 and 59 of the shelf 41, in combination with the midplane 171, can be provided with guides (e.g., rails 181) and keying e.g., offset connector positioning for the insertion of the FRUs into the enclosure and midplane 171. The midplane 171 can be a double-sided, or multi-layer printed circuit board (PCB) assembly that can be mounted vertically in a rigid manner within the enclosure. It can carry connectors 175 on a front surface 172 for making electrical connection with corresponding connectors on the information processing cartridges 43. It can also carry connectors 177 and 179 on rear surface 173 for making electrical connection with corresponding connectors on the CSSPs 71 and the PSUs 81. Conductive tracks (not shown) on and through the midplane 171 can be provided to interconnect the various connectors. In addition, the midplane can provide connectors for receiving corresponding connectors connected to first and second indicator assemblies 183 and 184 that each accommodate a respective set of LED indicators 69. In the present example, the midplane 171 is not configured as a FRU and is not hot swappable.

A plurality of cartridge guides 97 can be provided at the underside of the plenum chamber floor member 94.

A CSSP/PSU divider 96 can be provided to the rear of the midplane 171 and can extend horizontally to the rear face 59 of the shelf enclosure 47. The CSSPs 71, when inserted, are supported by the divider 96. To aid the correct insertion of the CSSPs 71, CSSP guide pins 178 are provided on the midplane 171 at positions adjacent connectors 177 on the midplane 171 for connection to the CSSPs 71.

Respective positions 88 and 89 can be formed in the front face 57 and the rear face 59 at which first and second indicator assemblies 183 and 184 accommodating the indicator LEDs 69 can be located. These positions 88, 89 therefore include an aperture or apertures through the respective exterior panel of the shelf enclosure 47 such that indicator LEDs may be viewed from outside the shelf enclosure.

The midplane supports a number of paths for various power and signal lines to interconnect the FRUs.

Also, each PSU 81 has a management signal connection (e.g., a serial I2C (Inter-IC Bus) connection) to the CSSP cartridge 71 to control power and monitor environmental parameters. The I2C bus comprises of two signals SCL and SDL (serial clock line and serial data line). In addition, an I2C address programming pin is provided for the PSUs 81.

In the present implementation, indicator assemblies 183 and 184 (see FIG. 5) are provided at the front and rear of the system. The indicator assemblies can be configured as FRUs. In this example they accommodate three system-level indicator LEDs and can include a FRU identity (FRU-ID) programmable read-only memory (PROM) each. Various LED indicators can be provided. There can, for example, be a white locator LED that can be switched by the user for locating the system; a green power-on LED to indicate when the system is powered; and an amber service-required LED to indicate a fault or other condition requiring servicing. These LEDs and components of the indicator assembly can be driven by either of the CSSPs 71.

Figures 8, 8A, 8B:
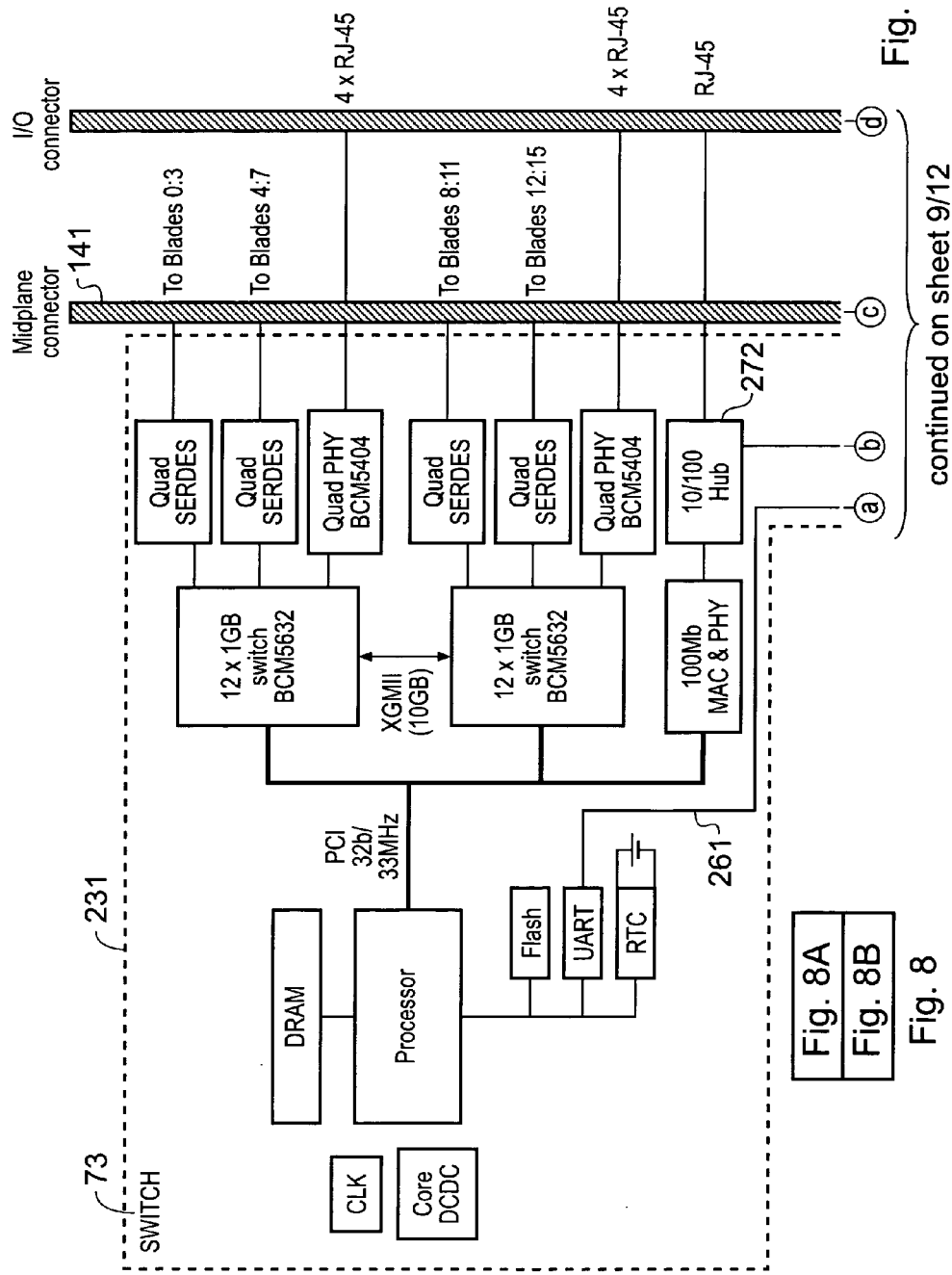
FIGS. 8A and 8B are a functional block diagram of an example of an information processing subsystem for the combined switch and service processor module.
Figure 8B:
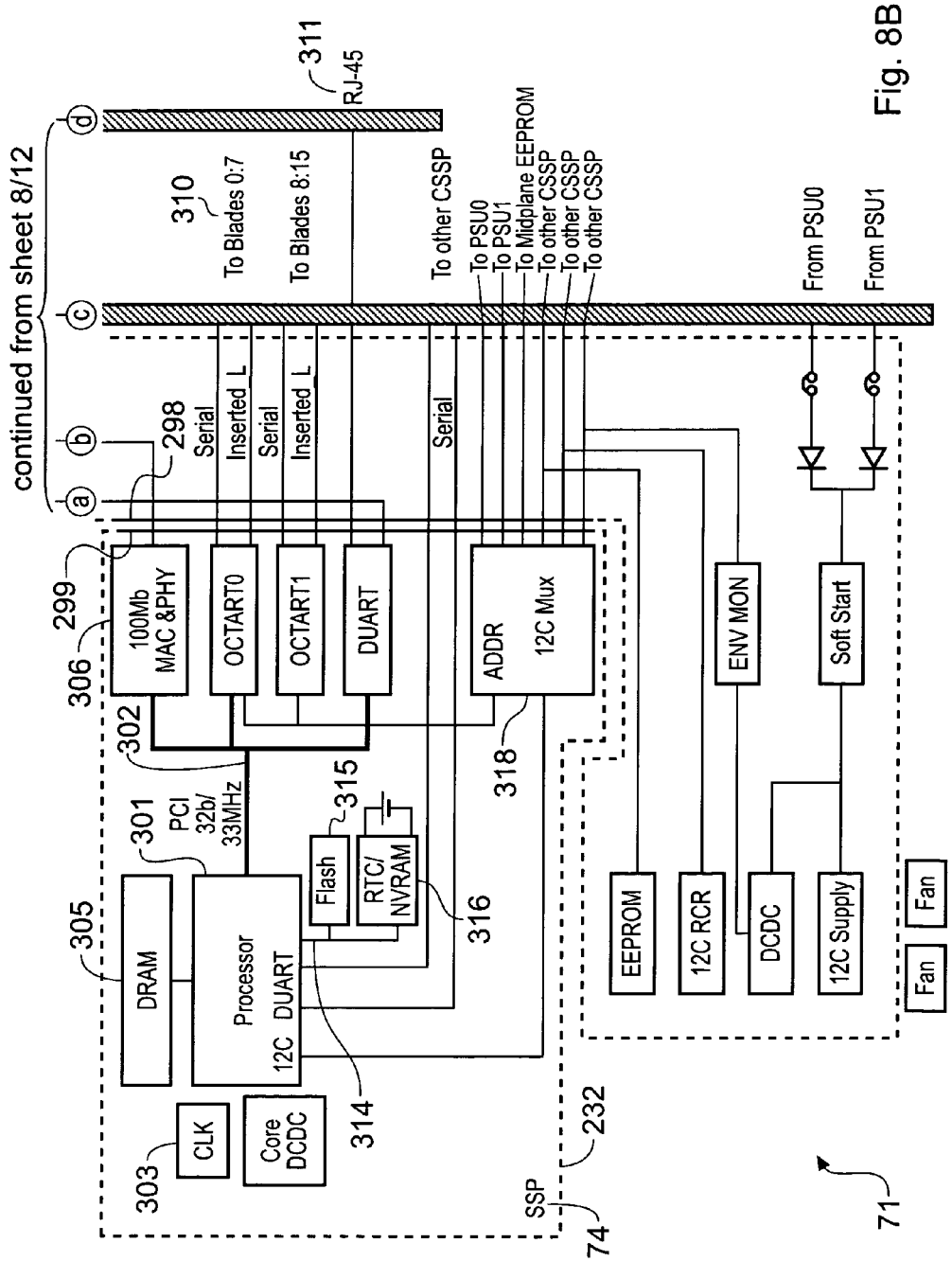

With reference to FIGS. 8A and 8B, there now follows a description of an example of a combined switch and service processor (CSSP) 71. In the present example, each CSSP 71 provides the functionality of a Switch 73 and of a Shelf Service Processor, or Shelf Service Processor (SSP) 74.

Figure 12:
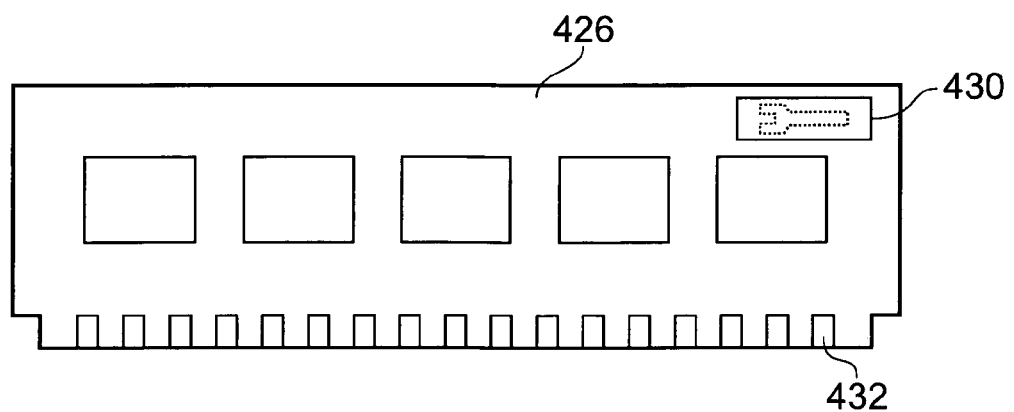
FIG. 12 is a schematic representation of a component in the form of a memory module incorporating a non-volatile fault indicator.

FIGS. 8A and 8B provide an overview of the functional components of the CSSP 71 including functional components of the Switch 73 and functional components of the SSP 74. In the present example, most of the components relating to the Switch 73 are mounted on a Switch PCB 231, and the components relating to the SSP 74 are provided on a SSP PCB 232. However, it should be noted that the components located in the lower portion of the switch PCB 231 (i.e., that portion below the SSP PCB 232 as illustrated in FIG. 12) logically belong to the SSP 74, rather than to the switch 73. It will be appreciated that such component arrangements are not compulsory for successful operation and that any other component arrangement over any number of component boards can be easily achieved using conventional component arrangement techniques.

With reference to FIG. 8 FIGS. 8A and 8B, there now follows a description of functional elements of the Shelf Service Processor (SSP) portion 74 of a CSSP 71 as contained within the CSSP enclosure and provided on an SSP PCB 232.

In the present example, communication between the Switch PCB 231 and the SSP PCB 232 is facilitated by an interboard connector pair 298 and 299. It supports connections (pins) for I2C signals, 10/100 MAC/PHY output, and power. As described above, the switch PCB 231 carries the components associated with the switch, and it also carries the power, FRU-ID and environmental monitoring components along with the connectors for connections to the midplane 171 and external connectors. Thus, in the present example, all SSP components requiring a connection to the midplane 171 or an external connection have signal paths routed through the connector pair 298, 299 and via the switch PCB 231 to the relevant midplane or external connectors.

In the present example, the SSP 74 includes a microprocessor 301 (e.g., a Power PC (MPC8245) processor) mounted on the SSP printed circuit board (PCB) 232. The processor 301 can be connected to a PCI bus 302, the present instance a 32 bit bus that operates, for example, at 33 MHz/66 MHz. A clock input to the processor 301 can be provided by a clock generator (CLK) 303. The processor 301 can be provided with a DRAM memory 305.

An integrated MAC/PHY switch 306 can provide its own interface to the PCI bus 302. The MAC/PHY switch 271 can be connected to 10/100 Ethernet hub 272 via the interboard connectors 298, 299. A loopback mode can be provided by the MAC/PHY switch 306 for system diagnostics.

Octal UARTs 308 and 309 can be connected between the PCI bus 302 and the interboard connector pair 298, 299. The signal path can be continued from the interboard connector pair 298, 299 to serial connections 310 on the midplane connector 141 on switch PCB 231. The Octal UARTS 308, 309 can facilitate serial communications between the SSP 74 and each of the processing cartridges 43.

Also connected to the PCI Bus 302 can be a dual UART (DUART) 312 that in turn can connect via the interboard connectors 298, 299 to serial bus 261 for providing an asynchronous console connection from the SSP 74 to the switch 73. The DUART 312 can also have an I2C connection to an external connector on the rear face 122 of the CSSP enclosure 121. The external connector can provide a common operating system/boot console and command port 311.

Connected to the processor 301 via an XBus 314 can be a Flash PROM 315. The Flash PROM 315 can store a real time operating system, and management and configuration data for the microprocessor 301. The Flash PROM 315 can be operable in the present example to hold up to 2 MB of data, depending on the software required. To facilitate I2C communications between the SSP 74 and the other CSSP 71, the midplane 171 and the PSUs 81, a multiplexer 318 can be provided. The multiplexer 318 can have a single I2C connection to the processor 301 and connections, via the interboard connector pair 298, 299 and the midplane connector 141 to both PSUs 81, the midplane 171 and the other CSSP 71.

LED indicators 137 can be provided, for example with a green power LED, an amber LED for indicating that service is required and a blue LED for indicating that the switch is ready to be removed. LED indicators integrated on 2×4 stacked RJ45 connectors on the rear face of the CSSP 71 can be arranged, for example, to show green continually when the link is present and flash green when the link is active.

The SSP 74 can access the I2C devices (FRU-ID EEPROM, 8-bit I/O expansion chip, and the system hardware monitor) through the midplane 171.

Returning to FIG. 4, the non-volatile fault indicators 400 and the operation thereof will be described in more detail.

As illustrated in FIG. 4, a respective non-volatile display is located adjacent each memory module 196. Although in the present example, only two memory modules are shown, it will be appreciated that in other example embodiments, another number of one or more memory modules may be provided. In the present example, each non-volatile fault indicator is mounted on the motherboard 191 adjacent to a socket (not shown in FIG. 4) for a respective memory module 196.

Figure 9:
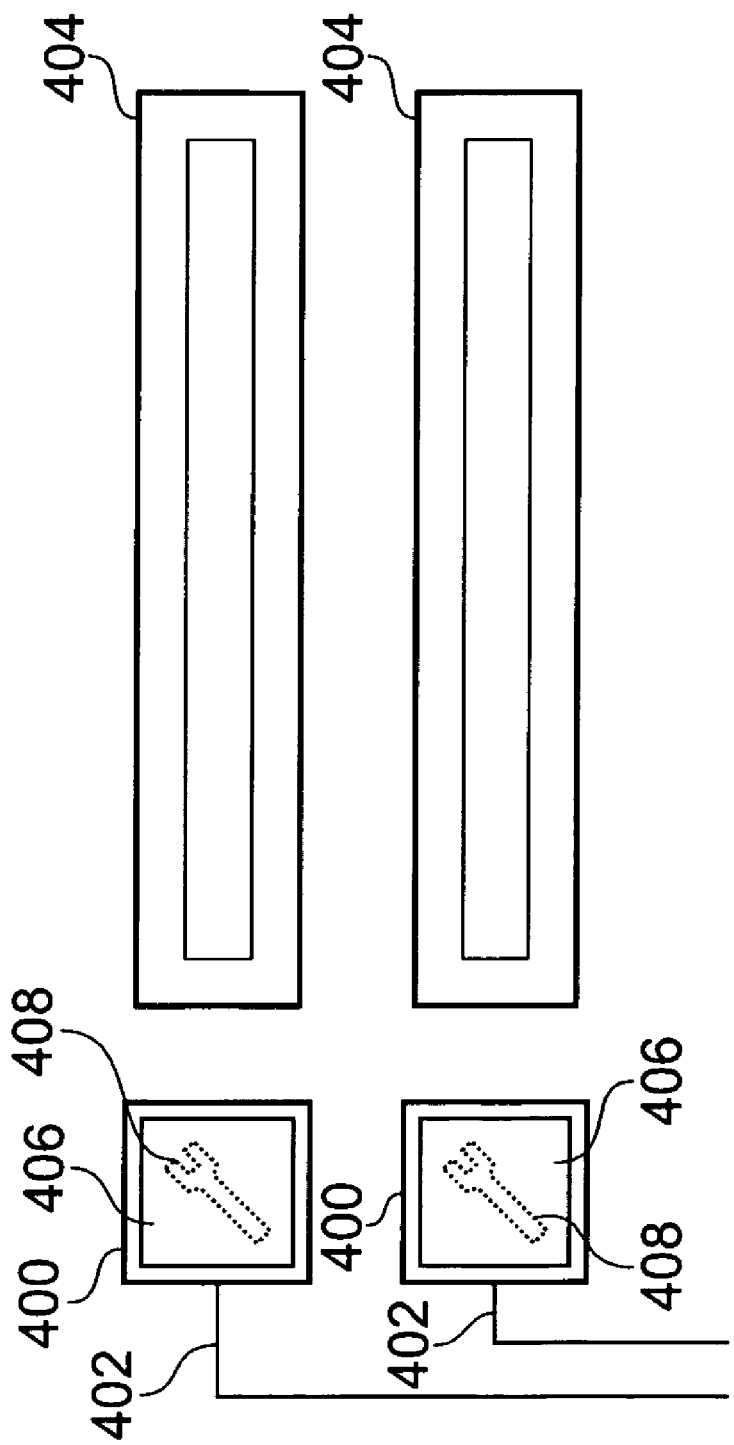
FIG. 9 is a schematic representation of one example of a non-volatile fault indicator.

FIG. 9 is a schematic representation of simple non-volatile fault indicator 400 adjacent to a socket 404 for a memory module. As illustrated in FIG. 9, the non-volatile fault indicator comprises a display 406 that carries a spanner symbol 408 that becomes active when the indicator is set to indicate that the memory module in the adjacent socket is faulty. In the present instance, the spanner symbol is not visible (i.e. it is the same could as the display background) until set and then it is changes to black when set. However, it will be appreciated that in other examples the whole display could, for example, be black and the symbol could appear in white when set. A control signal for changing the display state is supplied by the system controller via the control lines 402.

In the present example embodiment each non-volatile fault indicator 400 is a zenithal bistable display. A zenithal bistable display is a display that uses a simple microstructured grating surface to control the alignment of liquid crystal molecules. There are two stable orientations for the molecules, namely black and white. The zenithal bistable display is manufactured using a master to stamp a profile into deformable material to form grating layer. This grating layer is then used as an inner layer in a display that can be made using conventional LCD manufacturing lines. Such zenithal bistable displays are available from ZBD, Malvern, UK.

A zenithal bistable display provides an example of a display in which power only needs to be supplied in order to change the state of the display. For example the display could be blank (white) when no fault has been detected. During this time no power needs to be supplied to the display. However, the service controller is operable to monitor the operation of system components, and on a fault in a memory module being detected by the service controller or otherwise, the service controller can be operable to supply a control signal to the non-volatile fault indicator to change its state so that the fault symbol (e.g., the spanner symbol) is displayed in black. Of course other colors could be used, for example by changing the color of the display background.

Following the change of the display, the display does not need to be powered to maintain the display of the fault symbol. Accordingly, on powering down the information processing cartridge 43, for example on removal of the information processing cartridge to effect the replacement of the faulty component, the display of the fault symbol is maintained. This then facilitates identification of the faulty component by a service operator.

Figure 10:
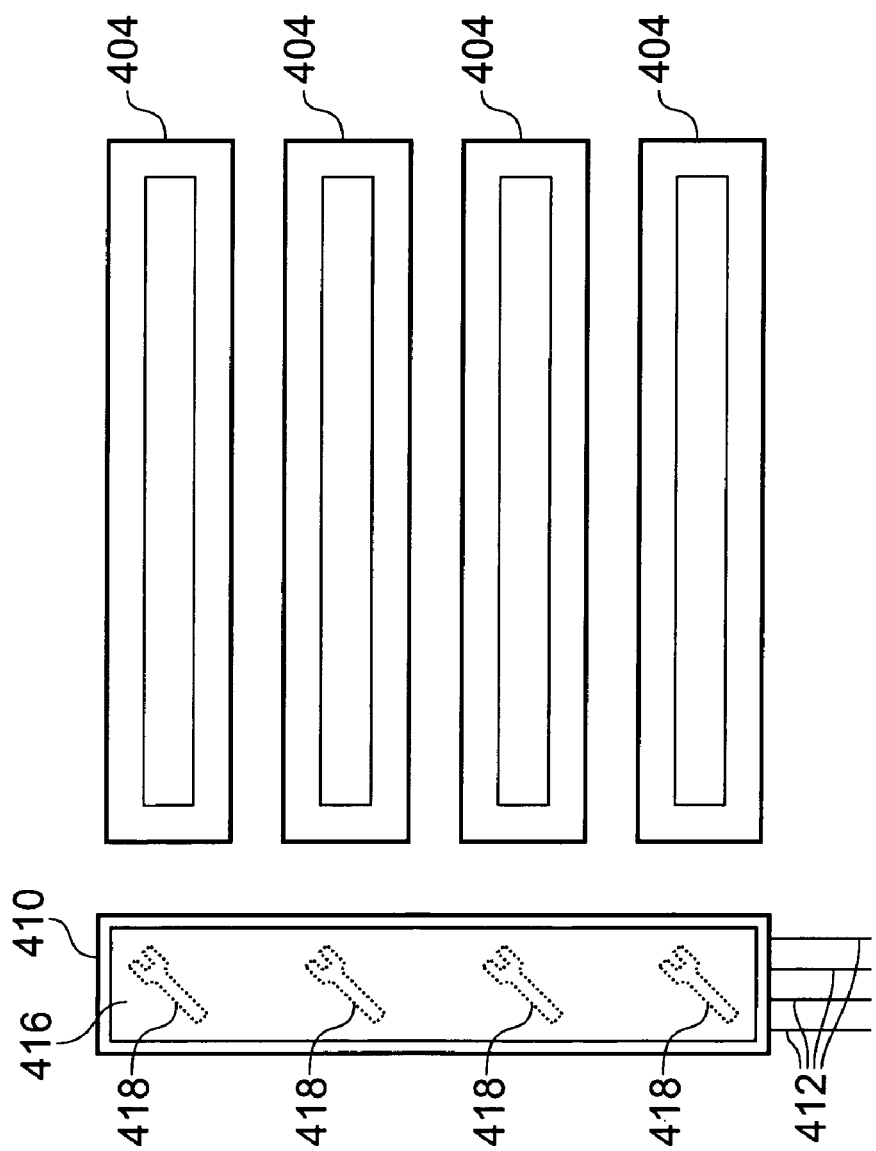
FIG. 10 is a schematic representation of another example of a non-volatile fault indicator.

FIG. 10 is a schematic representation of an alternative non-volatile fault indicator 410 that includes multiple fault indicators and is configured to be positioned adjacent to a plurality of memory module sockets. As illustrated in FIG. 10, the non-volatile fault indicator 410 comprises a display 416 that carries a plurality of spanner symbols 418, each of which is aligned with a respective memory module socket 404. Respective control lines 412 are provided for each of the spanner symbols, whereby the system controller can be operable to make the spanner symbol active that is adjacent to a memory module that has become faulty. Although in FIG. 10, a respective signal line is provided for each symbol, it will be appreciated that a single line or a reduced number of lines can be provided and decoding logic can be provided for decoding signals sent by the system controller to the non-volatile indicator, in the manner that an LCD is able to decode signals for controlling the LCD.

As a further alternative, rather than simply displaying a fault symbol (e.g., a spanner symbol) the non-volatile fault indicator could be configured to provide further information about the faulty component. For example, the non-volatile fault indicator could include an alphanumeric display on which details of the nature of the fault could be displayed. Alternatively, or in addition, a single non-volatile fault indicator could be located in a positional relationship to a plurality of system components and the non-volatile fault indicator could be configured to display a number or a name identifying the faulty component. For example, if four sockets for respective memory modules were labeled with a respective number in the range of 1 to 4, then non-volatile fault indicator could be configured to indicate the number of a faulty component or components.

Although in the examples described above, the non-volatile fault indictors are mounted on a motherboard proximate to or adjacent to the socket for the components concerned, any other suitable mounting that could give a clear indication of the component concerned could be used.

Figure 11:
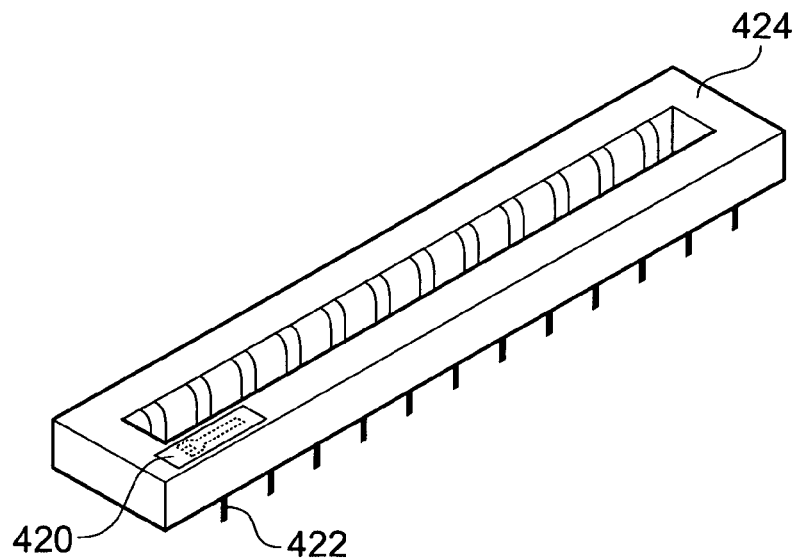
FIG. 11 is a schematic representation of a component socket including a non-volatile fault indicator.

For example in another embodiment, the non-volatile fault indicator could be built into the socket for the component concerned. As the non-volatile fault indicator can be configured compactly, this could readily be mounted on or otherwise incorporated into the socket. FIG. 11 is a schematic representation of a socket 424 that incorporates a non-volatile fault indicator 420. The incorporation of the fault indicator into the socket would increase the cost of the socket, but this can provide a more compact arrangement of the components and can reduce the number of the component to be assembled on the motherboard. One or more of the socket connections 422 for connection to a circuit board could be allocated for the control signals for controlling the change of state of the non-volatile fault indicator 420.

As a further example, the non-volatile fault indicator could be incorporated into the system components themselves. For example FIG. 12 illustrates a memory module in the form of a dual in line memory module (DIMM) 426 that includes a non-volatile fault indicator 430. The only modification of the DIMM needed to incorporate the non-volatile fault indicator is the provision of a mounting location on the memory board for the non-volatile fault indicator 430 and the provision of the control signal lines to connectors 432 on the edge of the memory module board for switching the state of the non-volatile fault indicator. As will be apparent, unless the control signals are multiplexed onto existing signal lines, a memory socket including additional signal connectors for the control signal lines is needed to receive the memory module including the non-volatile fault indicator.

Accordingly, there has been described the use of a non-volatile fault indicator in a positional relationship with at least one system component that is settable to maintain a fault indication for the component after powering down of the computer system. In this regard, it is to be understood that the non-volatile fault indicator does not need any power, once set, to maintain the fault indication. Accordingly, a non-volatile fault indicator as used in the present invention is distinguished from a volatile fault indicator that requires a source of back-up power when a system is powered down. If, for example, a light emitting diode were to be used as a fault indicator, then a back-up source of power, for example in the form of a battery or a super-capacitor (supercap), would be needed when the computer system is powered down. Batteries have a limited life and super-capacitors are large and expensive. An LED does not, therefore, form a non-volatile fault indicator.

Although the embodiments above have been described in considerable detail, numerous variations and modifications will become apparent to those skilled in the art once the above disclosure is fully appreciated. It is intended that the following claims be interpreted to embrace all such variations and modifications.

For example, although examples of the present invention have been described for providing a persistent indication of the presence of a fault in a memory module, for example a dual in-line memory module, it will be appreciated that the present invention can be applied to other system components that are usually serviced when the computer system has been powered down, for example a disk drive or a IO card embedded within a computer system.

What is claimed is:

1. A computer system comprising:
 a system controller;
 a plurality of system components; and
 in a positional relationship with at least one system component, a non-volatile fault indicator configured to indicate a fault associated with the at least one system component during operation of the computer system;
 wherein, in response to detecting a fault in the at least one system component, the system controller is configured to set the non-volatile fault indicator;
 wherein the non-volatile fault indicator is operable to maintain the fault indication without power after powering down of the computer system.

2. The computer system of claim 1, wherein the non-volatile fault indicator is located adjacent to said at least one system component.

3. The computer system of claim 1, wherein a respective non-volatile fault indicator is located adjacent to each of a plurality of system components.

4. The computer system of claim 1, wherein the non-volatile fault indicator is integrated in a socket for the system component.

5. The computer system of claim 1, wherein the non-volatile fault indicator is carried by the system component.

6. The computer system of claim 1, wherein said at least one computer system component is a dual in-line memory module.

7. The computer system of claim 1, wherein the non-volatile fault indicator comprises a display that is settable to display a fault symbol.

8. The computer system of claim 1, wherein the non-volatile fault indicator comprises a display that is settable to display alphanumeric symbols.

9. The computer system of claim 1, wherein the non-volatile fault indicator comprises a display that only requires power to change a displayed state.

10. The computer system of claim 9, wherein the non-volatile fault indicator is a zenithal bistable display.

11. The computer system of claim 1, further comprising a a motherboard, wherein the non-volatile fault indicator is mounted on the motherboard.

12. The computer system of claim 1 comprising a circuit board, a socket on the circuit board configured to receive the system component and the non-volatile fault indicator being positioned adjacent to the socket.

13. The computer system of claim 1, wherein the non-volatile fault indicator corresponding to the at least one system component is operable to maintain the fault indication without power after powering down of the computer system and after removing the at least one system component from the computer system.

14. A method of indicating a fault in a system component of a computer system that comprises a plurality of system components and a system controller, the method comprising:
 during operation of the computer system, detecting a fault in a system component;
 setting a non-volatile fault indicator which is in a positional relationship with the system component that has developed the fault to indicate the fault associated with the system component using the system controller; and
 the non-volatile fault indicator maintaining the fault indication without power after powering down of the computer system.

15. The method of claim 14, wherein the non-volatile fault indicator is located adjacent to the system component.

16. The method of claim 14, wherein the non-volatile fault indicator is integrated in a socket for the system component.

17. The method of claim 14, wherein the non-volatile fault indicator is carried by the system component.

18. The method of claim 14, wherein the computer system component is a dual in-line memory module.

19. The method of claim 14, wherein the non-volatile fault indicator comprises a display that is settable to display a fault symbol.

20. The method of claim 14, wherein the non-volatile fault indicator comprises a display that is settable to display alphanumeric symbols.

21. The method of claim 14, wherein the non-volatile fault indicator comprises a display that only requires power to change a displayed state.

22. The method of claim 21, wherein the non-volatile fault indicator is a zenithal bistable display.

23. The method of claim 14, wherein the system controller, on detecting a fault in the system component, further reports the fault to a remote system administrator.

24. A computer system comprising:

a system controller;

a plurality of system components; and non-volatile fault indicator means in a positional relationship with at least one system component for indicating a fault associated with the system component during operation of the computer system;

wherein, in response to detecting a fault in the system component, the system controller is configured to set the non-volatile fault indicator;

wherein the non-volatile fault indicator means is configured to maintain the fault indication without power after powering down of the computer system.

* * * * *